(12) United States Patent
Demaray et al.

(10) Patent No.: US 6,362,097 B1
(45) Date of Patent: Mar. 26, 2002

(54) COLLIMATED SPUTTERING OF SEMICONDUCTOR AND OTHER FILMS

(75) Inventors: Richard Ernest Demaray, Portola Valley; Chandra Deshpandey, Fremont; Rajiv Gopal Pethe, Sunnyvale, all of CA (US)

(73) Assignee: Applied Komatsu Technlology, Inc., Tokyo (JP)

( * ) Notice: Subject to any disclaimer, the term of this patent is extended or adjusted under 35 U.S.C. 154(b) by 0 days.

(21) Appl. No.: 09/115,258

(22) Filed: Jul. 14, 1998

(51) Int. Cl.$^7$ ............................................. H01L 21/44
(52) U.S. Cl. ....................................... 438/674; 438/792
(58) Field of Search ........................... 438/658, 46, 622, 438/632, 655, 646, 482, 589, 641, 647, 674, 764, 766, 771, 792, 763, 702; 29/447; 204/192.12, 192.11, 298; 257/412, 315, 377, 775, 522; 427/573

(56) References Cited

U.S. PATENT DOCUMENTS

| 3,457,467 A | 7/1969 | Amsterdam et al. ......... 136/261 |
| 4,163,987 A | 8/1979 | Kamath et al. .............. 136/262 |
| 4,255,211 A | 3/1981 | Fraas .......................... 136/249 |
| 4,445,965 A | 5/1984 | Milnes ......................... 438/95 |

(List continued on next page.)

FOREIGN PATENT DOCUMENTS

| EP | 0 509 305 A1 | 10/1992 | |
| EP | 0 652 308 A2 | 5/1995 | |
| EP | 0 704 890 A1 * | 4/1996 | ........... H01L/21/66 |
| JP | SHO [1983]-67016 | 4/1983 | |
| JP | 2-184594 | 7/1990 | |
| JP | 2-196086 | 8/1990 | |
| JP | 2-229792 | 9/1990 | |
| JP | 6-128072 | 5/1994 | |
| JP | 8-119793 | 5/1996 | |

OTHER PUBLICATIONS

A. Achiq, R. Rizk, R. Madelon, F. Gourbilleau and P. Voivenel, Growth control and properties of microcrystallized silicon films deposited by hydrogen plasma sputter, Thin Solid Films PP16–18, Feb. 1997.*

S.M.Rossnagel and J.J. Cuomo, "Ion Beam Deposition, Film Modification and Synthesis", Mrs Bulletin, vol. XIII, No. 12, Dec. 1988, pp. 40–45.

Rossnagel et al., "Ion Beam Bombardment Effects During Film Deposition," Vacuum, vol. 38, No. 2, pp. 73–81, (1988).

(List continued on next page.)

Primary Examiner—Long Pham
Assistant Examiner—William David Coleman
(74) Attorney, Agent, or Firm—Fish & Richardson

(57) ABSTRACT

Thin semiconductor films or layers having a pre-selected degree of crystallinity, from amorphous material to polycrystalline material, can be obtained by selecting an appropriate aspect ratio for a collimator used during a sputtering process. The orientation of the deposited film also can be tailored by selection of the collimator aspect ratio. Sputtered collimation permits highly crystalline films to be formed at temperatures significantly below the annealing temperature of the sputtered material. Thus, required fabrication steps and increase the throughput of the use of low temperatures allows films of substantially greater crystallinity and carrier mobility to be fabricated on glass and other low temperature substrates. Additionally, thin semiconductor Trapped charge defects also can be reduced by grounding the collimator to provide electrical isolation between the charged plasma particles and the substrate on which the sputtered layer is to be formed. Dielectric films having a thickness as small as several hundred Å can be formed to fabricate high transconductance devices with high breakdown strengths. improved electrically active interfaces, such as a rectifying junction between a semiconductor layer and a dielectric layer or an ohmic junction between intrinsic and doped semiconductor materials.

30 Claims, 6 Drawing Sheets

U.S. PATENT DOCUMENTS

| | | | |
|---|---|---|---|
| 4,508,609 A | | 4/1985 | Moustakas et al. ..... 204/192.25 |
| 4,565,997 A | | 1/1986 | Seko et al. .................. 340/576 |
| 4,633,284 A | | 12/1986 | Hansell et al. ................. 257/58 |
| 4,654,295 A | | 3/1987 | Yang et al. .................. 430/314 |
| 4,681,982 A | | 7/1987 | Yoshida ...................... 136/249 |
| 4,717,681 A | | 1/1988 | Curran ........................ 438/314 |
| 4,824,544 A | * | 4/1989 | Mikalesen et al. .......... 204/298 |
| 4,843,443 A | | 6/1989 | Ovshinsky et al. ........... 257/59 |
| 4,881,979 A | | 11/1989 | Lewis ......................... 136/249 |
| 5,384,281 A | * | 1/1995 | Kenney et al. ............. 438/702 |
| 5,401,675 A | * | 3/1995 | Lee et al. ................... 438/653 |
| 5,512,775 A | * | 4/1996 | Cho ............................ 257/522 |
| 5,538,910 A | * | 7/1996 | Oku ............................ 438/102 |
| 5,569,936 A | * | 10/1996 | Zhang et al. ................. 257/66 |
| 5,584,973 A | | 12/1996 | Wada et al. ............ 204/192.12 |
| 5,624,536 A | | 4/1997 | Wada et al. ............ 204/298.11 |
| 5,641,711 A | | 6/1997 | Cho ............................ 438/763 |
| 5,643,428 A | * | 7/1997 | Krivokapic et al. ... 204/298.11 |
| 5,646,063 A | * | 7/1997 | Mehta et al. ............... 438/425 |
| 5,658,438 A | * | 8/1997 | Givens et al. ......... 204/192.11 |
| 5,665,629 A | | 9/1997 | Chen et al. ................. 438/384 |
| 5,701,088 A | * | 12/1997 | Fujimaki .................... 324/765 |
| 5,702,573 A | * | 12/1997 | Biberger et al. ....... 204/192.12 |
| 5,705,042 A | | 1/1998 | Leiphart et al. ......... 204/192.3 |
| 5,709,958 A | * | 1/1998 | Toyoda et al. .............. 428/620 |
| 5,711,858 A | * | 1/1998 | Kontra et al. .......... 204/192.15 |
| 5,725,739 A | | 3/1998 | Hu .......................... 204/192.3 |
| 5,738,731 A | | 4/1998 | Shindo et al. .............. 136/249 |
| 5,750,012 A | * | 5/1998 | Ireland et al. ......... 204/192.12 |
| 5,755,944 A | * | 5/1998 | Haven et al. ............... 204/486 |
| 5,770,026 A | * | 6/1998 | Lee ........................ 204/298.11 |
| 5,877,084 A | * | 3/1999 | Joshi et al. ................... 438/46 |
| 5,885,425 A | * | 3/1999 | Hsieh et al. ........... 204/192.12 |
| 5,958,193 A | * | 9/1999 | Brugge .................. 204/192.13 |
| 6,001,461 A | * | 12/1999 | Toyoda et al. .............. 428/210 |
| 6,016,012 A | * | 1/2000 | Chatila et al. .............. 257/775 |
| 6,113,750 A | * | 9/2000 | Shinmura et al. ...... 204/192.12 |
| 6,130,470 A | * | 10/2000 | Selcuk ....................... 257/534 |
| 6,136,165 A | * | 10/2000 | Moslehi ................. 204/298.06 |

OTHER PUBLICATIONS

Ohmi et al., "Study on further reducing the epitaxial silicon temperature down to 250 °C in low–energy bias sputtering," J. App. Phys., vol. 69, No. 4, pp. 2062–2071 (1991).

J.S. Williams, "Subsurface Processing of Electronic Materials Assisted by Atomic Displacements", Mrs Bulletin, Jun. 1992, pp. 47–51.

* cited by examiner

PHYSICAL CONSTANT OF AMORPHOUS Si:H AND
SINGLE-CRYSTALLINE Si

| PHYSICAL CONSTANT (300°C) | | AMORPHOUS Si:H | SINGLE-CRYSTALLINE Si |
|---|---|---|---|
| LOCALIZED LEVEL DENSITY | $(cm^{-3}eV^{-1})$ | $10^{16} \sim 10^{17}$ | $\sim 10^{12}$ |
| ELECTRON MOBILITY | $(cmV^{-1}sec^{-1})$ | $0.8 \sim 10^{-2}$ | 1500 |
| HOLE MOBILITY | $(cmV^{-1}sec^{-1})$ | $10^{-2} \sim 10^{-3}$ | 500 |
| HOLE DIFFUSION LENGTH | $(\mu m)$ | $0.2 \sim 1$ | 200 |
| ELECTRON LIFETIME | $(sec)$ | $\sim 10^{-5}$ | $2.5 \times 10^{-3}$ |
| HOLE LIFETIME | $(sec)$ | $\sim 10^{-5}$ | $2.5 \times 10^{-3}$ |
| DARK CONDUCTIVITY(p&n LAYER) | $(\Omega^{-1}cm^{-1})$ | $1 \sim 10^{*})$ | $10^3 \sim 10^4$ |
| DARK CONDUCTIVITY(i LAYER) | $(\Omega^{-1}cm^{-1})$ | $10^{-8} \sim 10^{-11}$ | $4 \times 10^{-6}$ |
| PHOTOCONDUCTIVITY**) | $(\Omega^{-1}cm^{-1})$ | $10^{-3} \sim 10^{-4}$ | $\sim 10^0$ |
| OPTICAL BAND-GAP | $(eV)$ | $1.5 \sim 1.8$ | 1.1 |
| LIGHT ABSORPTION COEFFCIENT***) | $(cm^{-1})$ | $1.5 \sim 3 \times 10^4$ | $5 \times 10^3$ |

*) MICROCRYSTALLINE Si   **) 100mW/cm²
***) INCIDENT PHOTON ENERGY (hυ) :2eV where
- μm = micron
- cm = centimeter
- eV = electron volt
- V = volt
- sec = second
- Ω = ohm

FIG._1

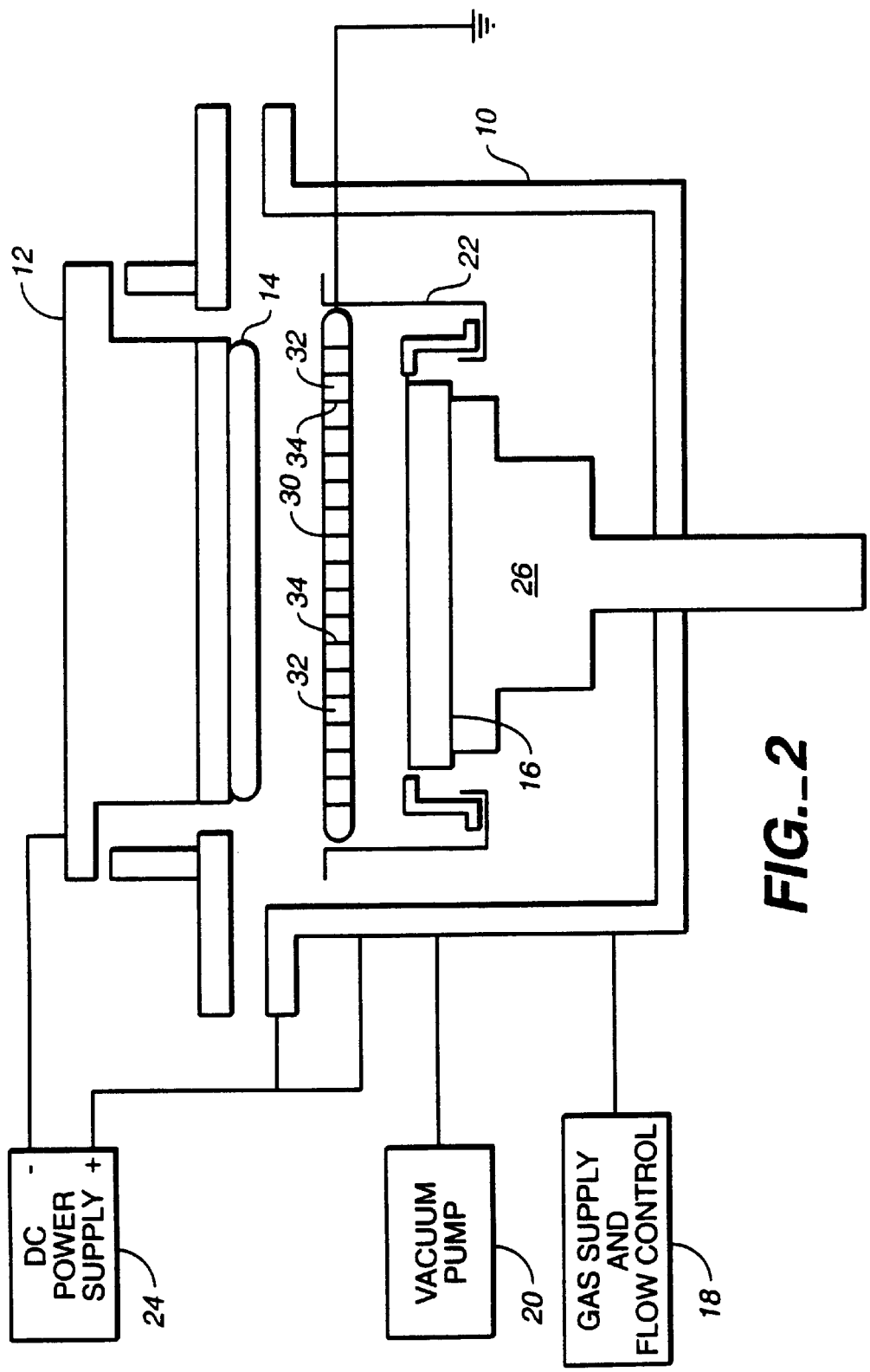
FIG._2

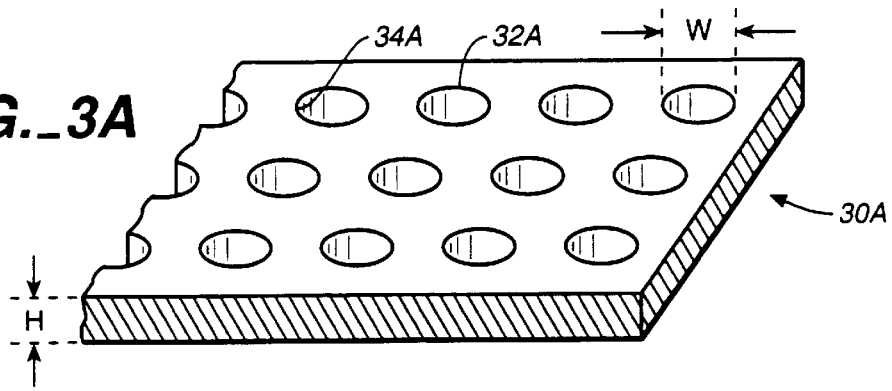
FIG._3A
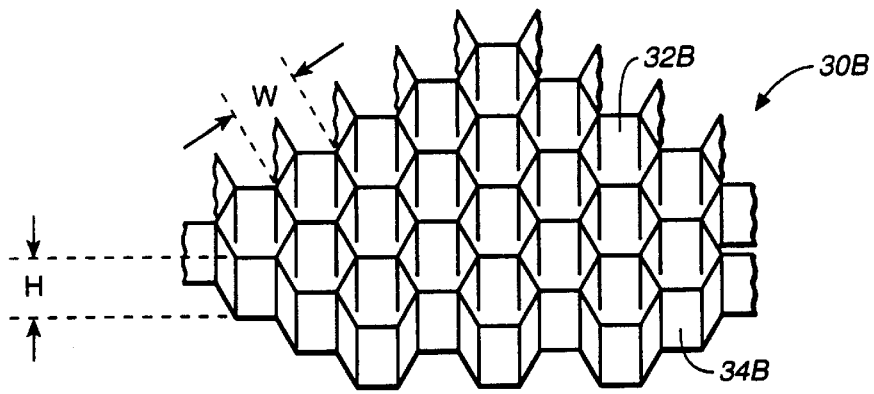
FIG._3B
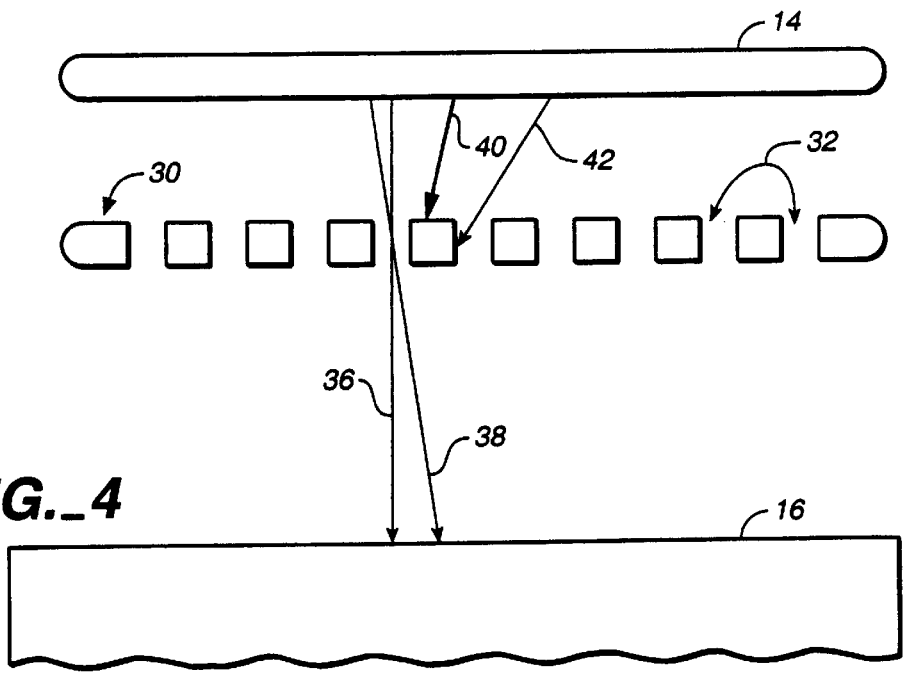
FIG._4

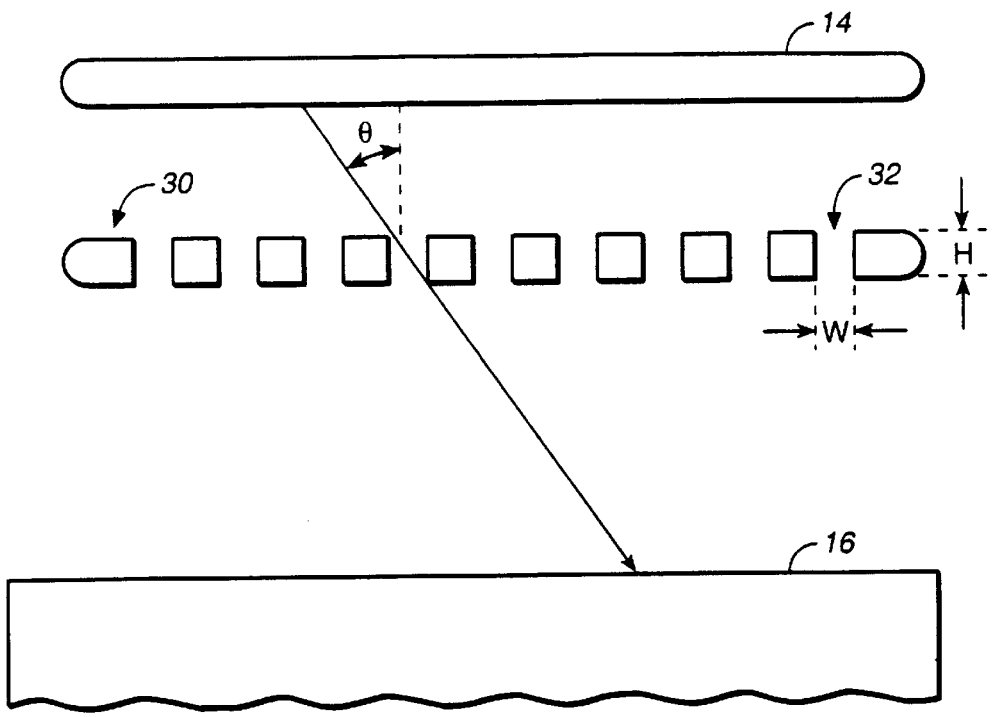
FIG._5A
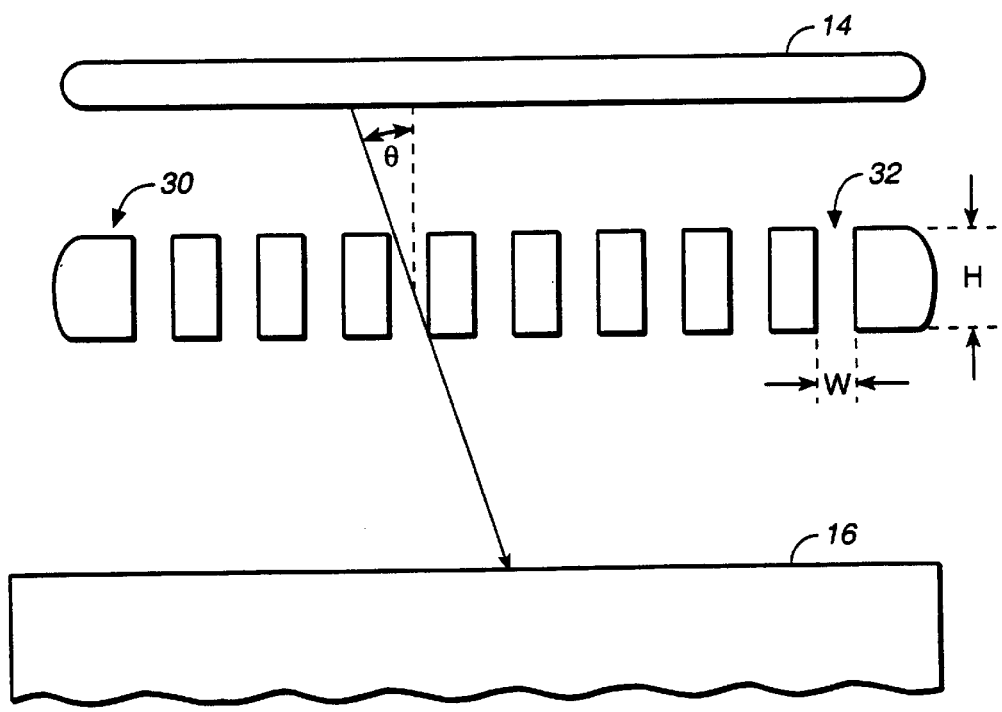
FIG._5B

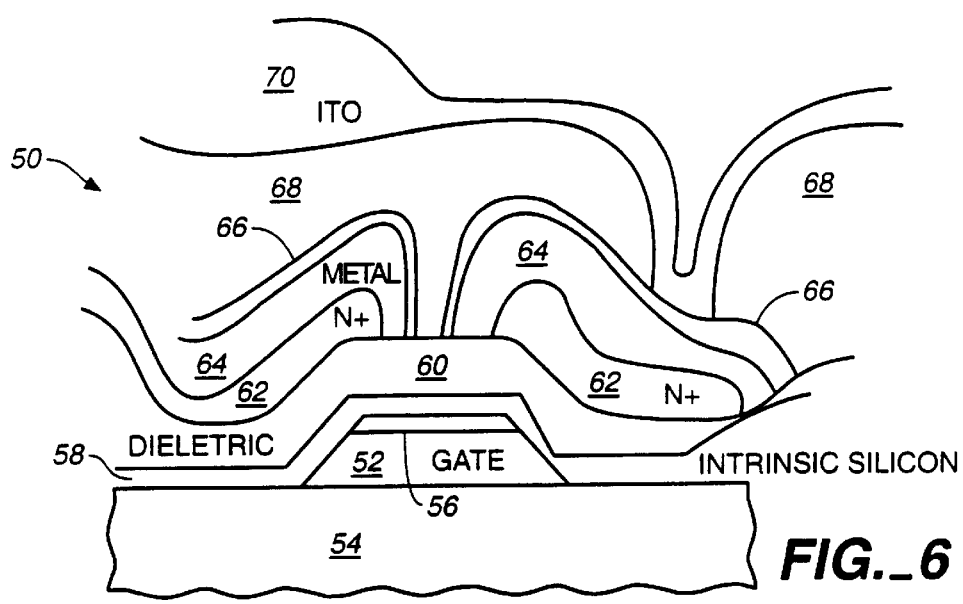
FIG._6
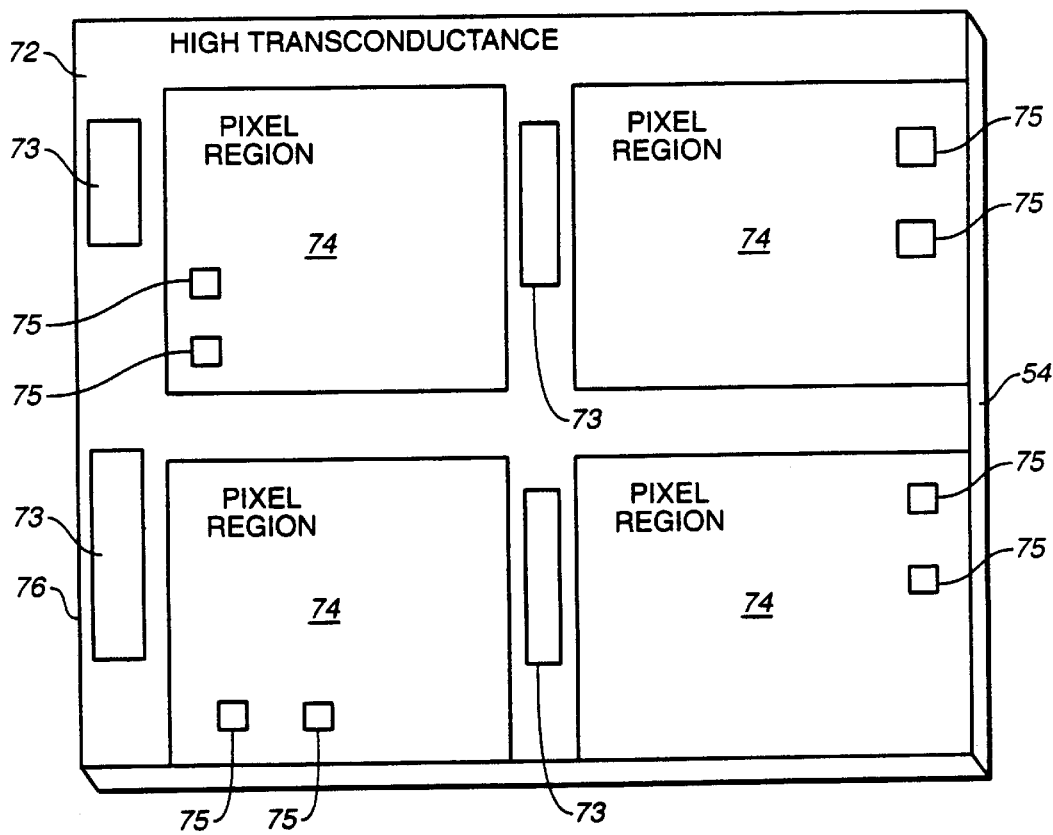
FIG._7

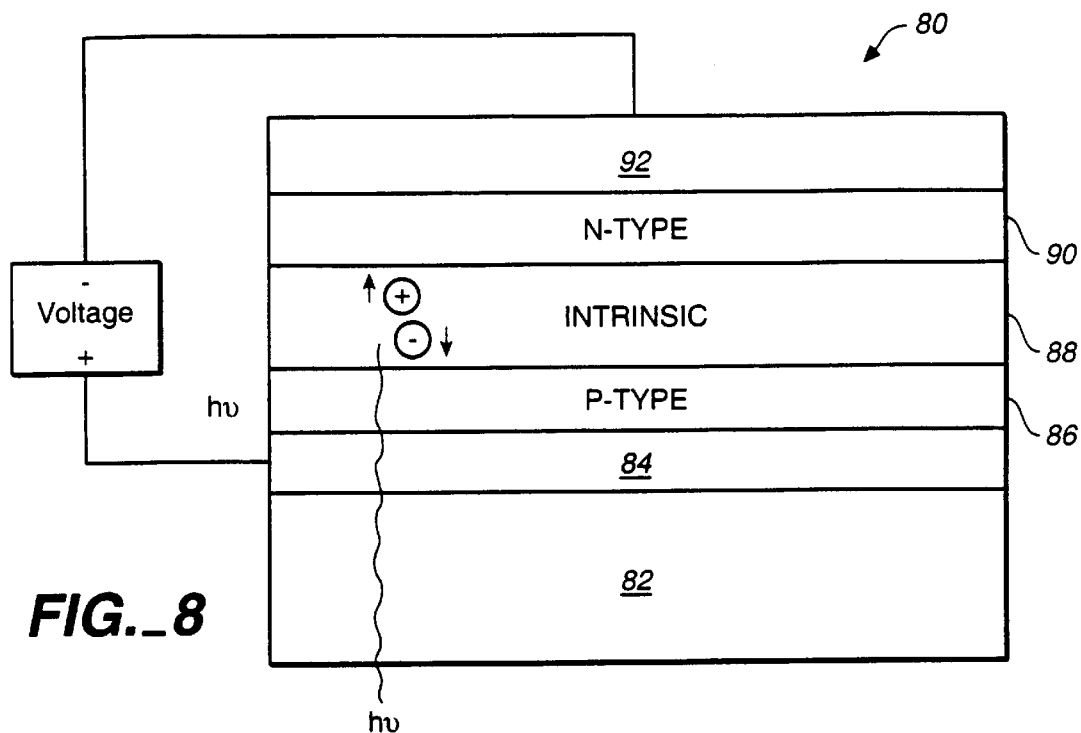
FIG._8
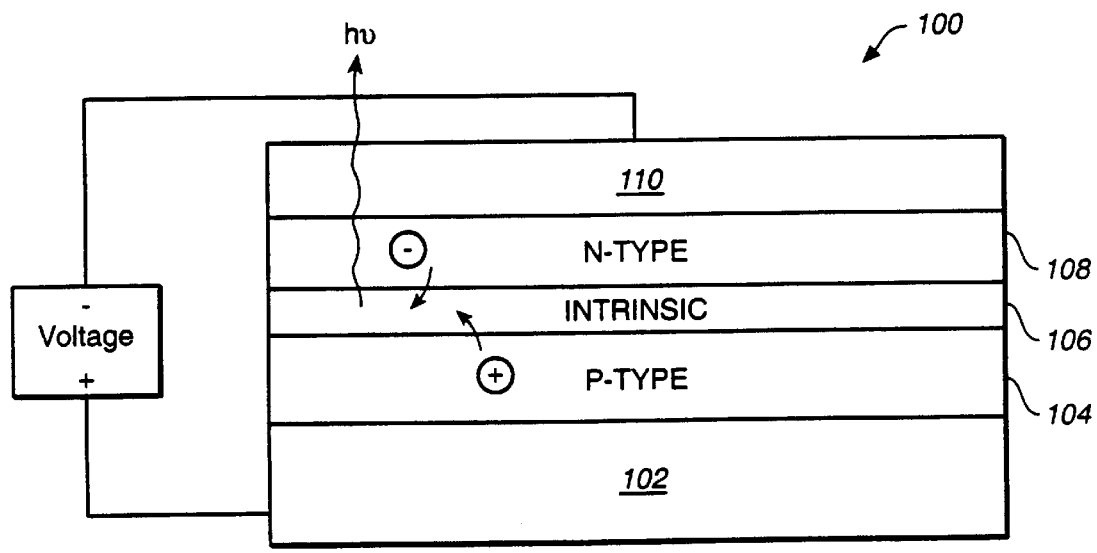
FIG._9

COLLIMATED SPUTTERING OF SEMICONDUCTOR AND OTHER FILMS

BACKGROUND

The present invention relates generally to the formation of semiconductor and other films and, in particular, the formation of such films using collimated sputtering techniques.

Sputtering describes a number of physical techniques commonly used, for example, in the semiconductor industry for the deposition of thin films of various metals and other materials on a substrate such as a glass plate or a semiconductor wafer. In general, physical vapor deposition (PVD) sputtering techniques involve producing a gas plasma of ionized inert gas, such as argon (Ar). Particles of the ionized gas are attracted to a "target" material by an applied electric field in an evacuated chamber. The ionized particles collide with the target. As a result of the collisions, free atoms or groups of atoms of the target material are ejected from the surface of the target, essentially converting the target material to the vapor phase comprised of free atoms or molecules. In the low pressure range, near 1 milliTorr (mTorr) of Ar pressure, most of the free particles which escape the target surface in the direction of the substrate strike the substrate without intervening collisions with the Ar gas and form a thin film on the surface of the substrate being processed.

One common sputtering technique is magnetron sputtering in which a magnetic field is used to concentrate sputtering action in the region of the magnetic field so that the target sputtering occurs at a higher rate and at a lower process pressure. The target, which is biased electrically with respect to the substrate and the chamber, functions as a cathode.

Although direct current (DC) techniques for supplying a target with an electric potential are effective with a metallic or conducting target material, DC magnetron sputtering generally has not been employed in the fabrication of thin semiconducting films for commercial electronic devices. Rather, radio frequency alternating current (AC) power commonly is utilized for supplying the electric potential to an insulating target material, such as intrinsic silicon (Si). A high frequency potential, however, generates a plasma effect so as to bombard the film with charged particles of the plasma during the film's deposition and growth, thereby causing damage to the film.

The electronic and other properties of Si differ considerably depending on the degree of crystallinity of the material (see FIG. 1). In particular, factors affecting the electronic and optical properties of silicon include the degree of crystallinity, the grain size and distribution, and the orientation of the grains. Other factors affecting the properties of Si films include the defect distributions in the grains, on the grain boundaries and in the interstitial phase, as well as physical defects such as voids or pinholes, which are caused by poor nucleation at the beginning of film growth. Such factors affect properties such as the final density of the film, the film's index of refraction, its ability to absorb light, and the conductivity of carriers, among others.

For example, thin films of sputtered silicon are generally amorphous when deposited in a vacuum by sputtering at low temperature. Amorphous films are referred to as "alpha" or "a" type films and have a low fraction of crystalline composition. Amorphous silicon (a—Si) sputtered films also generally have high defect distributions which limit their performance. The defects can significantly reduce the electron and hole flux in devices such as transistors and solar cells.

Although the electron mobility of a—Si is generally sufficient for thin film transistor (TFT) applications such as a TFT flat panel liquid crystal display (TFT-LCD), the minority carrier mobility and lifetime are severely limited by trapped charge, by the concentration of vacancy defects, and by other grain boundary-related defects. Similarly, reactive sputtered Si in hydrogen has excessive electron spin resonance so that the band-gap and mobility are not useful for solar cell or other optical detection devices. Thus, due to the defect distributions and a low degree of crystallinity, sputtered Si films generally have a high deposited sheet resistivity and are not useful for electronic applications requiring high conductivity. Consequently, sputtered a-Si thin films are not used in commercial applications such as TFT LCDs or thin solar voltaic films.

Poly-crystalline silicon (poly-Si) also is used in many electronic devices, including the fabrication of TFT-LCD devices. Depending on the degree of crystallinity, the size and orientation of the crystals, the kind of defects and their distribution in the crystals and on the boundaries, poly-Si films can have very high carrier mobility and good transistor properties for use in integrated microelectronic devices. Previously developed techniques, such as a silane and disilane plasma enhanced chemical vapor deposition (PECVD), can provide the desired electronic properties such as electron mobility, but require a relatively high substrate temperature of approximately 550 degrees Celsius (° C.) or higher. Similarly, annealing processes used to form poly-Si from an a-Si precursor film also require substrate temperatures which are above 650° C. for annealing on the order of days and near 850° C. for annealing on the order of hours. Such high temperatures prevent those techniques from being used with low temperature substrates like the glass substrates used in LCD applications or low cost plastic substrates.

Although the use of poly-Si is desirable in many applications, previous chemical vapor deposition (CVD) techniques and PVD techniques have not provided a combination of useful deposition rates, uniform wide area substrate capability and useful degrees of crystallinity for commercial applications. For example, it is difficult to provide highly uniform thin films on large glass substrates having dimensions on the order of about 550 millimeters (mm) by 650 mm and larger.

To deposit such poly-Si or micro-crystalline Si, a number of difficulties must be overcome. Those difficulties include the energetic and kinetic barriers to crystal nucleation, in other words, the difficulties in starting crystal growth, particularly at temperatures below the annealing point of the material to be deposited and at small crystal grain sizes. Even the time and temperature conditions used for annealing result in initial grains having diameters of hundreds of angstroms (Å), poor quality and high defect density, rather than high quality grains of 50 to 100 Å in diameter.

Many semiconductor devices also include one or more dielectric layers. For example, a metal-oxide-semiconductor (MOS) transistor includes a metal gate, an oxide or other dielectric layer, and a high mobility semiconducting layer such as Si. The performance of the transistor junction depends, in part, on the quality of the semiconductor to dielectric interface. Defects at the interface and within several hundred Å of the interface can cause a decrease in switching performance of the transistor. In addition, the breakdown threshold of the dielectric limits the minimum thickness of the gate dielectric. Since the conductance of a transistor is proportional to the gate capacitance, it is inversely proportional to the thickness of the dielectric layer. A thinner dielectric layer results in higher current. A typical silicon nitride thickness, which has been used as a dielectric layer in TFT-LCDs, is in the range of about 1500–2000 Å. Thinner dielectric films, however, have not been possible at low temperatures without annealing due to dielectric breakdown.

Sputtering also generally has not been used in the fabrication of optical thin films, such as laser mirror coatings, because the threshold of ablation depends on the vacancies, the trapped charge concentration and the physical defects such as pinholes and voids. Such defects scatter light and degrade optical signals which is particularly problematic in low light or high resolution applications.

Summary

In general, according to one aspect, a method of depositing a layer of a semiconductor material having a pre-selected degree of crystallinity includes providing a substrate in an evacuable chamber and providing a source of the semiconductor material in the chamber spaced from the substrate. The source of semiconductor material is sputtered with a gas plasma. Trajectories of sputtered semiconductor particles are collimated to a surface of the substrate using a collimator having an aspect ratio selected to form on the substrate surface a film of semiconductor material having the pre-selected degree of crystallinity.

According to another aspect, a method of depositing a layer of a dielectric material having a pre-selected degree of crystallinity or a pre-selected strength (volts per centimeter) includes providing a substrate in an evacuable chamber and providing a target material in the chamber spaced from the substrate. The target material is sputtered with a gas plasma, and a reactive gas is provided in a vicinity of the sputtered target material. Trajectories of sputtered particles are collimated to a surface of the substrate using a collimator having an aspect ratio selected to form on the substrate surface a dielectric material having the pre-selected degree of crystallinity or the pre-selected strength.

According to another aspect, a method of fabricating an electronic device having an electrically active junction includes forming a semiconductor layer and forming a dielectric layer, wherein at least one of the semiconductor layer and the dielectric layer is formed by collimated sputtering, and wherein the semiconductor and dielectric layers are disposed adjacent one another to form the electrically active junction.

In yet a further aspect, a method of fabricating an electronic device having an electrically active junction includes forming an intrinsic semiconductor layer and a doped semiconductor layer of a first conductivity type, wherein at least one of the intrinsic and doped layers is formed using collimated sputtering and wherein the intrinsic and doped layers are disposed adjacent one another to form the electrically active junction.

As described in greater detail below, collimated sputtering can be used in the formation of various semiconductor and dielectric layers of integrated electronic devices including, for example, transistors, flat panel displays, and devices for emitting or detecting light, among others. Collimated sputtering can be used to deposit, for example, one or more layers that form an electrically active interface, such as a rectifying junction between a semiconductor layer and a dielectric layer or an ohmic junction between intrinsic and doped semiconductor materials. Collimated sputtering also can be used to form optical thin films that are used, for example, in precision or high powered optics.

In some implementations, a substrate on which the sputtered material is to be deposited is isolated electrically from charged plasma particles. For example, a collimator can be grounded or biased electrically to prevent charged plasma particles from reaching the substrate. Alternatively, where collimation of the sputtered particles is not required, a conducting grid with a small aspect ratio, for example, an aspect ratio less than 0.5, can be mounted between the target material and the substrate and can be grounded or electrically biased to isolate the substrate from the charged plasma particles.

Various implementations of the present invention include one or more of the following advantages. Greater flexibility is provided in forming layers of semiconductor and dielectric materials of varying degrees of crystallinity at relatively low temperatures. In particular, a pre-selected degree of crystallinity, from amorphous material to poly-crystalline material can be obtained by selecting an appropriate aspect ratio for the collimator used during a sputtering process. In general, a high aspect ratio favors nucleation and crystal growth of the sputtered material, although the rate of transmission of the sputtered material through the collimator decreases with increasing aspect ratio.

Moreover, at a given temperature, the degree of crystallinity can be enhanced as much as two to ten times by collimated sputtering when compared to a film formed without collimation. Alternatively, the use of collimation can provide a given degree of crystallinity at a lower temperature compared to a non-collimated process. If the temperature is decreased, the collimated process eventually will cease to nucleate crystalline films. Nevertheless, at such a very low temperature, a film deposited by the collimated process can have a higher density and can exhibit higher acoustical impedance and higher dielectric breakdown strength.

The crystal orientation of the deposited film also can be tailored by selection of the collimator aspect ratio. For example, the degree to which the adsorbed material will orient itself with the densest crystalline axis perpendicular to the substrate generally increases when a collimator with a large aspect ratio is used. For cubic crystalline material, such as Si, the<111> axis tends to form perpendicular to the plane of the film. Such a crystal orientation can impart important electrical, thermal, and optical transport properties to the film.

In addition, sputtered collimation permits highly crystalline films to be formed at temperatures significantly below the annealing temperature of the sputtered material. Thus, subsequent annealing or remelting steps can be eliminated from some existing processes, thereby reducing the number of required fabrication steps and increasing the throughput of the system. Moreover, the use of low temperatures allows films of substantially greater crystallinity and carrier mobility to be fabricated on glass and other low temperature substrates. The use of collimated sputtering, for example, with a uniform, full-face magnetron can improve the uniformity of a deposited layer. of material. Uniformities of about 2 precent can be obtained for layers deposited on glass substrates having dimensions on the order of about 550 millimeters (mm) by 650 mm, 650 mm by 830 mm, and larger.

Additionally, thin semiconductor and dielectric films can be formed at low temperatures with a reduced number of voids and vacancies. Trapped charge defects also can be reduced by grounding the collimator or conducting grid to provide electrical isolation between the charged plasma particles and the substrate on which the sputtered layer is to be formed. Thus, for example, dielectric films having a thickness as small as several hundred Å can be formed to fabricate high trans-conductance devices with high breakdown strengths. Additionally, devices can be fabricated with improved electrically active interfaces, such as a rectifying junction between a semiconductor layer and a dielectric layer or an ohmic junction between intrinsic and doped semiconductor materials.

Other features and advantages will be apparent from the detailed description, the accompanying drawings and the claims.

BRIEF DESCRIPTION OF THE DRAWINGS

FIG. 1 is a table showing physical constants of amorphous silicon and single crystal silicon.

FIG. 2 is a cross-section of a chamber for performing a collimated sputtering process according to the invention.

FIGS. 3A and 3B are partial perspective views of exemplary collimators for use in the chamber of FIG. 2.

FIG. 4 is a cross-sectional view illustrating a function of a collimator according to the invention.

FIGS. 5A and 5B are cross-sectional views illustrating collimators with different aspect ratios.

FIG. 6 is a cross-sectional view of an exemplary bottom gate n-type MOS thin film transistor pixel.

FIG. 7 illustrates a substrate with multiple regions having dielectric layers of different thicknesses formed thereon.

FIG. 8 is a cross-sectional view of an exemplary photovoltaic cell.

FIG. 9 is a cross-sectional view of an exemplary light detecting diode.

DETAILED DESCRIPTION

Referring to FIG. 2, an evacuable sputtering chamber 10 includes a target mount 12 for holding a substantially planar target or source 14, and a support 26 for holding a substrate 16 to be processed. The substrate 16 can comprise, for example, a glass plate or a semiconductor wafer. Typically, substrate preparation such as cleaning or the predeposition of a different material is performed to enhance the nucleation and growth of a sputtered film. Thus, the substrate 16 also may include one or more previously-formed layers of other materials disposed on the glass plate or semiconductor wafer.

The target mount 12 is connected to a power supply 24 which establishes a voltage potential between the grounded chamber 10 and the target 14 on the mount 12. Specifically, the negative terminal of the power supply 24 is connected to the target mount 12, and the positive terminal of the power supply is grounded to the chamber 10. An amount of AC power with a frequency selected to provide a capacitive charging of the target is added to the applied DC power. The addition of the AC power has the effect of transferring the DC power to the sputtering process. In the case of an active plasma, plasma modes with one or more frequencies of the applied AC power store power. Such as oscillating plasma power helps generate the sputtering action.

The chamber 10 also includes a gas supply and flow controls 18 to control the gas flow into the chamber 10, and an exhaust vacuum pump 20 for creating a vacuum in the chamber 10 during processing of the substrate 16. A shield 22 surrounds the substrate 16 to prevent sputtered material from being deposited on the chamber walls.

During sputtering, a substrate 16 resting on the support 26 is moved upward into a processing position. Positive ions in the plasma generated from the gas in the chamber 10 are drawn toward and strike the negatively-charged target 14, dislodging or sputtering particles of the target material which are accelerated toward the substrate 16.

Additional details of various features which may be included in some implementations of the chamber 10 can be found, for example, in one or more of the following U.S. patents which are incorporated by reference herein in their entirety: U.S. Pat. Nos. 5,565,071; 5,518,593; 5,676,803; 5,433,835; 5,595,337; 5,487,822; and 5,487,822.

In addition to substrate preparation, it has been found that the incoming angle of the physical sputtered vapor atoms play a key role in crystal nucleation and growth. Adsorption of sputtered atoms onto the substrate surface takes place as a result of losses of elastic energy and momentum from the adsorbed atom. The translational energy of the sputtered atoms is generally about one order of magnitude greater than the thermal energy of a stationary film atom in thermal equilibrium with the solid surface. However, subsequent to adsorption, the relaxation or loss of translational energy occurs so that the sputtered atoms become localized on the surface composed of similar atoms.

The excess or lost energy and momentum can be resolved into perpendicular and transverse components. The transverse energy and momentum components are transferred to similar components of other stationary surface atoms. Likewise, the perpendicular components are transferred to the perpendicular components of stationary surface atoms. Perpendicular energy and momentum components can consolidate the existing substrate or growing film so as to make the substrate or film more dense. For example, the perpendicular energy and momentum components can scatter existing atoms into vacancies or into lattice sites and can affect monolayers many layers beneath the surface to consolidate the material into an ordered structure along the direction of the highest density direction of the crystal lattice. Such scattering is more likely to occur when the range of energy and momentum is greater than the thermal energy of the solid, but less than the energy that would cause severe damage to the substrate or film surface. The scattering also is more likely to occur in the perpendicular direction of the vapor with respect to the film surface.

In contrast, transverse energy and momentum components can cause re-sputtering of the surface atoms and can cause a decrease in the packing density. After losing the transverse energy to the film, the low angle sputtered particles have low residual perpendicular energy which does not contribute to an increase in the growth of low density film. In addition, transverse mobility in the adsorbed phase leads to structures that grow by surface diffusion and which impede the formation of high density and high crystallinity films. Consequently, the elimination or control of the amount of low-angle incident sputtered particles can have an appreciable effect on the film density, the degree of crystallinity, the rate of crystal growth, and the direction of growth of the higher density planes with respect to the surface orientation, particularly at temperatures below the thermal activation for self-diffusion and growth.

Crystal growth is enhanced when the additional translational energy of the sputtered particles is perpendicular to a high density crystalline axis and is greater than the available thermal motion so as to exceed the barrier to motion. Under those conditions, crystalline density is increased along the axis or in the crystal plane perpendicular to the direction of the sputtered material. Therefore, the effect of angle control of the sputtered material is greatest at temperatures below the annealing temperature of the adsorbed material. At such temperatures, the surface film would not otherwise tend toward crystallinity during its consolidation from the vapor phase because it lacks the energy to overcome the barrier to motion onto the lattice.

Typical sputtering conditions provide a distribution of incoming trajectories that is cosine in nature. In other words, for equal solid angles, there is an equal probability of arrival of a sputtered atom at the surface of the substrate. Thus, the trajectories of more than two-thirds of the vapor particles form an angle of less than 45° with respect to the plane of the substrate. Consequently, the majority of trajectories of sputtered particles do not enhance film density or crystallinity.

The foregoing description reflects the inventors' current understanding as to why the incoming angle of the physical sputtered vapor particles affects crystal nucleation and growth. The invention, however, is not dependent on the accuracy or completeness of that theory which is intended simply as an attempt to provide as complete a picture as possible.

To control the degree of crystallinity of the deposited film, a collimator 30 having a substantially uniform distribution of parallel apertures 32 is arranged so that atoms having an angle, for example, greater than 45° to the normal, are collected on the vanes or sides 34 of the collimator. The collimator 30 is mounted between the target 14 and the substrate 16 and can be formed from a metal, such as aluminum, copper, stainless steel or titanium, although other materials also may be suitable for particular applications. In general, the collimator 30 can have an overall length and width which are about the same size as the dimensions of the target 14. For example, when depositing layers on glass substrates on the order of 550 mm by 650 mm and larger, the length and width of the collimator should exceed the width and length of the substrate by about 30–50 mm.

FIGS. 3A and 3B illustrate exemplary collimators 30A, 30B that can be used as the collimator 30. The collimator 30A has circular holes 32A with a diameter W and sides 34A whose height is H. The collimator 30A, thus, has an aspect ratio of H divided by W. The collimator 30B has honeycomb-shaped apertures 32B with a width W and vanes 34B whose height is H. The aspect ratio of the collimator 30B also is H divided by W. In alternative implementations, the shape of the apertures 32 of the collimator 30 can be square or hexagonal. Other shapes also are possible.

Referring to FIG. 4, directional arrows 36, 38 depict potential trajectories of travel by sputtered particles as they move from the target 14 toward the substrate 16. The path of arrow 36 is a direct (90° to the normal) perpendicular route from the target 14 to the substrate 16 and is not directly influenced by the presence of the collimator 30. A sputtered particle traveling along the trajectory of arrow 36 passes through one of the apertures 32 of the collimator 30 to the substrate 16. Similarly, a sputtered particle traveling along the trajectory of arrow 38 passes through one of the apertures 32 of the collimator 30 to the substrate 16. Sputtered particles traveling along the trajectories of arrows 40, 42 however, are prevented from reaching the surface of the substrate 16 by the collimator 30.

Using a collimator, for example, with an aspect ratio of about 1 (in other words, H equal to W) where the maximum angle θ of transmission is about 45° from the normal, approximately one-third of the sputtered material is transmitted through the collimator 30 toward the substrate 16 (FIG. 5A). Alternatively, using a collimator with an aspect ratio of about 3 (in other words, H equal to 3W) where the maximum angle θ of transmission from the normal is about 18 degrees, less than ten percent of the sputtered material is transmitted through the collimator 30 toward the substrate 16 (FIG. 5B).

By selecting the dimensions of the collimator 30, such as its aspect ratio, the degree of crystallinity of a film deposited by sputtering can be controlled. In other words, a pre-selected degree of crystallinity of a film deposited by a sputtering process can be achieved by positioning a collimator having appropriate dimensions between the target and the substrate. Thus, a collimator having an aspect ratio equal to or less than 1, between 1 and 3, or equal to or greater than 3 can be used in various sputtering applications. In general, the greater the aspect ratio of the collimator 30, the greater the crystallinity of the film deposited on the substrate 16. Practical constraints, however, may limit the maximum aspect ratio of the collimator 30. For example, although a high aspect ratio generally favors nucleation and crystal growth of the sputtered material, the rate of transmission of the sputtered material through the collimator decreases with increasing aspect ratio. Accordingly, a balance may need to be found between the requirements of providing a highly crystalline thin film and the throughput of the thin film deposition system.

Furthermore, it generally is desirable to place the collimator 30 at a distance from the substrate 16 at least about four to six times greater than the width W of the apertures 32. Such a condition can be referred to as a "far-field" condition and helps prevent shadowing or printing of the collimator shape in the deposited film by ensuring that each point on the substrate 16 has a view of the target 14 through multiple apertures 32 of the collimator 30.

In addition to providing a technique for selecting a range of angles for the trajectories of adsorbed atoms, the collimator 30 is constructed to isolate the substrate 16 from damage caused by the impact of electrically charged particles, such as electrons and ions. As illustrated in FIG. 2, the collimator 30 is grounded or electrically biased to collect the charged particles from the plasma. In some implementations, the collimator 30 is formed as a conducting screen or grid with a very small aspect ratio, for example, an aspect ratio of less than 1 or even less than 0.5. While such a collimator may have a minimum impact on the angular distribution or the flux of the sputtered particles, it nevertheless isolates the substrate 16 from damage by the charged plasma particles.

Using existing sputtering techniques, sputtered Si thin films typically have a very high sheet resistivity and a low percentage of crystallinity at temperatures above 200° C. At 200° C., the addition of collimation to the deposition conditions can provide up to an order of magnitude decrease in the sheet resistivity and as much as approximately a twenty percent degree of crystallinity for DC sputtered Si thin films using a collimator with an aspect ratio, for example, of about 1.5. At temperatures near 400° C., a degree of crystallinity of 80% or more can be achieved on glass or oxide-coated substrates using a collimator with an aspect ratio, for example, of about 3. Consequently, electrically active a—Si thin films having high carrier mobility and low defect density can be obtained using collimated sputtering. The addition and control of hydrogen gas present during such a process permits the band gap of the deposited film to be engineered over a broad range from crystalline Si (1.2 eV) to fully hydrogenated a—Si:H (1.85 eV). A photo to dark current ratio of $10^5$ or greater can be obtained.

In addition, the use of collimation during the sputtering process can substantially reduce the substrate temperature at which the amorphous to crystalline transition occurs for the deposited film. In contrast to previous disilane PECVD techniques which generally require temperatures of about 550° C. and higher to obtain poly-Si films, the use of collimation permits fabrication of a thin poly-Si film having an electron mobility of tens of cm$^2$/Volt-second at a substrate temperature significantly below the annealing temperature, for example, in the range of 400–500° C. or lower.

In one experimental test, for example, a Si layer having a thickness of about 415 Å was deposited using a standard DC PVD process on a first glass substrate having a thickness of about 1 mm. The standard DC PVD process was performed in the absence of a collimator at about 385° C. and a single-crystal Si target. A native silicon dioxide ($SiO_2$) layer having a thickness of about 25 Å was formed on the Si layer. The standard PVD process yielded a Si layer having a crystallinity of about 9.3 percent.

A second glass substrate was processed using a collimated PVD process. A Si layer having a thickness of about 517 Å was deposited by a collimated PVD process on a glass substrate having a thickness of about 1 mm. The collimated PVD process was performed using a collimator at about 200° C. and a single-crystal Si target. The collimator had honeycomb-shaped apertures with an aspect ratio of about 1.5 and was formed of stainless steel. A native oxide layer of $SiO_2$ having a thickness of about 33 Å was formed on the Si layer. The collimated PVD process yielded a Si layer having a crystallinity of about 18.1 percent. In other words, the collimated PVD process resulted in a Si layer of almost twice the degree of crystallinity at a significantly lower temperature. If the aspect ratio is increased to about 3.0, and the temperature is increased to about 385° C., the collimated PVD process can yield Si layers having degrees of crystallinity as high as sixty to seventy percent.

As previously noted, the ability to fabricate poly-Si films at a low temperature is advantageous due to the compatibility with low cost substrates for applications such as display systems or active devices on multi-chip modules. In addition, films having a very low hydrogen content and a high degree of crystallinity can be formed at low temperatures. Such films are preferred for use with excimer laser (ELA) annealing. Due to the high degree of crystallinity and very low impurity and hydrogen content, those films do not require laser power equivalent to the full melt threshold, but undergo, in part, solid phase re-crystallization.

Even where the substrate would not be damaged by processing at a higher temperature, depositing a poly-Si thin film using a collimated sputtering process can eliminate additional annealing steps which otherwise would be required to re-crystallize a deposited a-Si film. Alternatively, a thin a—Si film deposited by collimated sputtering can serve, for example, as a precursor to an excimer laser or other annealing process which causes the deposited film to re-crystallize. Since the a—Si film deposited by the collimated sputtering process can be made with a greater degree of crystallinity and with fewer defects, the subsequently annealed film will have a degree of crystallinity which is even greater than that which would be obtained in the absence of collimation.

In addition to providing a technique for forming thin silicon or other semiconducting films with a pre-selected degree of crystallinity, a collimated PVD sputtering technique also can be used to form thin dielectric films having a low pin hole density, a high degree of crystallinity, and a high breakdown strength. For example, a collimated reactive PVD sputtering technique can be used to form a high quality thin dielectric film of $SiO_2$ or silicon nitride (SiN). The target 14 can include silicon, and a reactive gas such as oxygen ($O_2$) or nitrogen ($N_2$) can be provided from the gas supply 18 to the chamber 10 in the vicinity of the substrate 16 or the sputtered particles. In contrast to the dielectric films of about 1500–2000 Å made by existing sputtering or PECVD techniques, the collimated sputtering process can be used to fabricate high quality thin dielectric films having thicknesses less than 1000 Å, for example 500 Å, and dielectric strengths significantly greater than $5 \times 10^6$ V/cm, for example $1 \times 10^7$ V/cm and higher. Such dielectric films can provide up to a three or four-fold increase in transconductance when used as a transistor gate dielectric. In general, a collimator with a higher aspect ratio will result in a higher degree of crystallinity, a higher strength, and a higher breakdown voltage. Thus, a dielectric layer with pre-selected degree of crystallinity, a pre-selected strength or a pre-selected breakdown voltage can be formed by collimated sputtering.

Moreover, by grounding the collimator 30 to isolate the substrate from the charged plasma particles, the deposited dielectric film can be formed with a trapped charge defect density less than about $1 \times 10^{11}$ per square centimeter (cm$^2$). Dielectric layers with low trapped charge defect densities can be used to provide improved switching characteristics in transistors or other switching devices. Furthermore, high temperature annealing steps can be eliminated. Thus, collimated sputtering can be used to fabricate a high strength thin dielectric film at a relatively low temperature with high transconductance and few defects. Dielectric films other than $SiO_2$ and SiN can be deposited through collimated sputtering by using a target 14 of another material and/or providing a different reactive gas to the chamber 10.

In one experimental test, a $SiN_x$ film having a thickness of about 500 Å was formed using a collimated PVD process on a p-type Si wafer. The collimator, which had honeycomb-shaped apertures with an aspect ratio of about 3.0, was made of stainless steel and was grounded to isolate the wafer electrically from the charged plasma particles. Aluminum dots having a radius of about 2 mm were formed on the $SiN_x$ layer to allow current-voltage (I-V) measurements and capacitance-voltage (C-V) measurements to be made. No dielectric breakdown was observed as the voltage was increased from 0 to 100 volts. The dielectric formed by the collimated PVD process thus exhibited a strength at least as high as about $20 \times 10^6$ V/cm. That value is several times greater than the dielectric strengths generally observed for dielectrics having a thickness of about 1500–2000 Å often used in electrically active devices. The thin high strength dielectric layer can provide an increase in capacitance, as well as an increase in transconductance compared to the thicker dielectric layers. Moreover, the total defect density ($N_{ss}$) was only about $3.2 \times 10^{10}$ per cm$^2$.

Collimated sputtering can be used to form various silicon or dielectric layers in integrated electronic devices such as transistors. As illustrated in FIG. 6, an exemplary bottom gate NMOS thin film transistor (TFT) 50 includes a metal gate 52 formed on a substrate 54. The gate 52 can be formed, for example, of aluminum (Al) and includes a molybdenum (Mo) layer 56 over the gate. Respective layers of intrinsic silicon 58 and a dielectric 60 are disposed over the gate 52 and the Mo layer 56. The interface between the intrinsic Si layer 58 and the dielectric layer 60 forms a rectifying junction. The N+ type silicon regions 62 are formed for the transistor source and drain, and a metallization layer 64 provides contacts for the N+ doped Si source and drain regions. A gate dielectric layer 66 is formed over the metallization layer 64, and a passivation nitride layer 68 is formed over the surface of the device 50. An indium tin oxide (ITO) layer 70 is formed as shown in FIG. 6 and covers the bottom of a via or hole through the passivation nitride layer.

Although the various layers of the transistor 50 can be fabricated according to known techniques, using collimated sputtering to form one or more of the intrinsic Si layer 58, the dielectric layer 60 and the N+Si layer 62 can provide a device with improved characteristics. For example, a pre-selected degree of crystallinity for the intrinsic Si layer 58 can be provided by using a collimator 30 with an appropriate aspect ratio. The dielectric layer 60 can include, for example, $SiN_x$ or $SiO_2$, and can have a high breakdown strength and a low defect density. Other dielectric films also can be formed using collimated sputtering.

In some implementations, for example, collimated sputtering can be used to form an intrinsic Si layer 58 of either amorphous micro-Si or poly-Si having a thickness of about 400–500 Å and a dielectric layer 60 having a thickness of about 1500–2000 Å. Alternatively, for high transconductance devices, collimated sputtering can be used, for example, to form an intrinsic Si layer 58 of micro-Si or poly-Si having a thickness of about 400–500 Å and a dielectric layer 60 having a thickness less than 1000 Å, for example, about 500 Å.

To form the N+ doped source and drain regions 62, a Si target 14 containing n-type dopants can be sputtered using collimation. Alternatively, an intrinsic Si target 14 can be used and a gas, such as arsine, can be flowed to the interior of the chamber 10 to provide the n-type dopants. Similarly, P+ doped regions or layers can be formed in transistors or other devices by providing a Si target containing p-type dopants or by using an intrinsic Si target with a flow of gas such as phosphine. The gaseous supply of dopants can be provided from the gas supply 18.

Collimated sputtering, therefore, can be used to fabricate transistors with high electron mobilities, high transconductance, and a low defect rectifying junction. Moreover, such properties can be achieved at temperatures significantly below the annealing temperatures of the sputtered materials. Consequently, such devices can be formed on glass or other low temperature substrates.

Glass substrates, for example, are being used for flat panel display applications such as active matrix television and computer displays, among others. Each glass substrate can include multiple display monitors each of which contains millions of pixels formed of memory devices, for example, TFTs such as the TFT 50. Collimated sputtering can, therefore, be used to fabricate the TFTs for such devices.

The use of collimated sputtering also allows high transconductance regions 72 and pixel or memory regions 74 to be fabricated on a single glass substrate 76 (FIG. 7). For example, collimated sputtering can be used to form a first thin dielectric layer having a low defect density and having a thickness, for example, of 500 Å over the upper surface of a glass substrate 54. A second dielectric layer having a thickness of about 1500–2000 Å can be formed on selected areas of the first dielectric layer by collimated sputtering to form the pixel or memory regions 74 using a shadow mask. The thicker dielectric in the pixel regions 74 helps decrease charging requirements for those regions. The areas of the first dielectric layer over which the second dielectric layer is not provided form the high transconductance or non-pixel regions 72. The high transconductance regions 72 can be used to form high transconductance electronic devices 73 such as high speed analog switches, column drivers, shift registers, comparators, analog-to-digital converters, digital-to-analog converters, power devices and logic devices, among others. Memory devices 75, such as the TFT 50, can be formed on the pixel or memory regions 74. Thus, a single glass substrate can include regions for high trans-conductance devices as well as pixel regions with the dielectric layers for both regions formed by collimated sputtering at temperatures significantly below the annealing temperature of the dielectric. Alternatively, the second dielectric layer can be formed by a standard sputtering process if a high deposition rate is preferred over an enhanced dielectric strength. Collimated sputtering also can be used to form other layers of the TFTs or other memory devices, as described above.

Furthermore, collimated sputtering can be used to form various of the semiconductor and/or dielectric layers in other types of transistors, including top-gate NMOS TFTs and complementary MOS (CMOS) type devices. Collimated sputtering can be particularly advantageous for fabricating the thin film layers that form a rectifying junction between a semiconducting material and a dielectric. Many p-doped Si layers benefit from a high degree of crystallinity and, therefore, higher carrier mobility. Schottky or metal-to-Si contacts also benefit from high carrier mobility and low defect density for low temperature applications.

In addition to integrated electronic devices having a rectifying junction between a semiconductor material and a dielectric, collimated sputtering can be used in the fabrication of integrated devices having an ohmic interface or junction between a doped semiconductor layer and an intrinsic semiconductor layer.

Referring to FIG. 8, an exemplary photovoltaic or solar cell 80 includes a glass substrate 82. A first transparent electrode 84 is formed on the substrate 82 and can be formed, for example, of a tin oxide ($SnO_x$) or an indium tin oxide ($In_ySn_xO_z$). A silicon layer 86 of a first conductivity type, for example, p-type, is disposed on the electrode 84. An intrinsic Si layer 88, such as amorphous silicon, is formed over the p-type Si layer 86. The interface between the p-type layer 86 and the intrinsic layer 88 forms a first electrically active or ohmic junction. A silicon layer 90 of a second conductivity type (n-type) opposite the first conductivity type is formed over the intrinsic layer 88. The interface between the intrinsic layer 88 and the n-type layer 90 forms a second electrically active or ohmic junction. A metal electrode 92 is formed on the n-type silicon layer 90. A voltage can be applied across the two electrodes 84, 92 so that when a photon (represented by hv in FIG. 8) is absorbed by the intrinsic layer 88, an electron-hole pair is generated and produces a current Although known techniques can be used to fabricate the various layers of the photovoltaic device 80, using collimated sputtering to form one or more of the p-type Si layer 86, the intrinsic Si layer 88, and the n-type Si layer 90 can provide a device with improved characteristics. For example, a collimator 30 with a high aspect ratio can be used to form a p-type poly-Si or micro-crystalline Si layer 86 having a thickness of several hundred Å and a transparent band-gap of about 1.2 eV. By grounding the collimator 30, electrical isolation is provided so as to reduce or eliminate trapped charge defects. Similarly, a collimator with a high aspect ratio also can be used to form an n-type poly-crystalline or micro-crystalline layer 90.

On the other hand, a collimator 30 with a low aspect ratio can be used with a supply of hydrogen gas to form an amorphous intrinsic Si:H layer 88 having a thickness, for example, of about 1000–2000 Å. The angular control provided by the addition of collimation can reduce void defects to form a denser a—Si:H film having a low sheet resistivity and a high photo to dark current ratio. Moreover, the electrical isolation provided by grounding the collimator 30 can reduce or eliminate the trapped charge defects in the intrinsic a—Si film. Reactive sputtering has been shown to provide such an a—Si film with sufficient hydrogen to achieve a band gap of 1.85 which is necessary for the efficient absorption of sunlight. Collimated, sputtered a—Si:H can, therefore, result in increased values for the minority carrier (hole) mobility and minority carrier lifetime. Moreover, compared to other processes such as DC glow discharge used for fabricating solar cells, the collimated sputtering process can increase the throughput of the system because the films formed by collimated sputtering can be formed more quickly than films of similar thickness formed by DC glow discharge. In addition, the semiconducting layers 86, 90 in the photovoltaic cell 80 as well as other photo-sensing devices that include an electrically active junction between an intrinsic semiconductor material and a doped semiconducting material can be fabricated at temperatures significantly below the annealing temperatures of the semiconductor materials, such as in the range 400–500° C. or lower.

Collimated sputtering also can be used to form various thin film layers in light emitting devices, such as PIN diodes. Referring to FIG. 9, an exemplary light emitting device 100 includes a first electrode 102. A semiconducting layer 104 of a first conductivity type, such as p-type germanium (Ge), is disposed on the electrode 102. An intrinsic semiconductor layer 106, such as Ge, is formed on the p-type layer 104. Alternatively, a Ge alloy or germanium-silicon-nitride (GeSiN$_x$) can be used for the layer 106. The intrinsic layer 106 of the device 100 is typically thinner than the intrinsic layer 88 of the photovoltaic device 80 of FIG. 8. The interface between the p-type layer 104 and the layer 106 forms a first ohmic junction. A semiconducting layer 108 of a second conductivity type, such as n-type Ge, is disposed on the intrinsic layer 106, and a transparent electrode 110 is formed on the n-type layer 108. The interface between the layer 106 and the n-type layer 108 forms a second ohmic junction. When a voltage is applied across the device 100, holes are injected from the p-type layer 104 into the intrinsic layer 106, and electrons are injected from the n-type layer 108 into the intrinsic layer 106. An injected hole and electron can recombine to emit a photon (represented by hv in FIG. 9) through the transparent electrode 110.

Although known techniques can be used to fabricate the various layers of the light emitting device 100, using collimated sputtering to form one or more of the p-type semiconducting layer 104, the intrinsic semiconductor layer 106, and the n-type semiconducting layer 108 can provide a device with improved characteristics. As in the photovoltaic device of FIG. 8, using collimated sputtering to form the intrinsic layer 106 can help reduce voids and vacancies in the film. Trapped charge defects also can be reduced by grounding the collimator 30 to provide electrical isolation between the charged plasma particles and the substrate on which the sputtered layer is to be formed. The degree of crystallinity of the p-type and n-type layers 104, 108 can be controlled by selection of the aspect ratio of the collimator 30. Furthermore, the band gap and, thus, the transparency, of the n-type layer 108 can be engineered more carefully by using sputtered collimation. As before, the semiconducting layers of photo emitting devices like the PIN diode 100 can be fabricated at temperatures significantly below the annealing temperatures of the semiconducting materials.

Semiconducting materials other than silicon and germanium also can benefit from advantages of the foregoing collimated sputtering techniques. For example, thin films of wide band-gap refracting materials such as cubic aluminum nitride (AlN), cubic silicon carbide (SiC) and boron nitride (BN) can be formed by collimated sputtering. A pre-selected degree of crystallinity for such layers can be achieved by using a collimator 30 with appropriate dimensions, including the collimator's aspect ratio. As previously discussed, in general, a higher aspect ratio provides a greater degree of crystallinity.

Similarly, diamond films can be formed using the collimated sputtering techniques described above. Collimated sputtering also can be used to obtain high rate nucleation and growth of other crystalline and amorphous semiconducting materials at low temperatures. Thus, controlling the range of angles for the trajectories of adsorbed atoms and providing electrical isolation from charged plasma particles allows high density, low defect films to be produced.

In addition, collimated sputtering can be used to form improved optical thin films, such as optical dielectric films. In some applications, amorphous optical films are desirable because the grain boundaries of crystalline films act as scattering sites or cause breakdown of the film. In such applications, collimated sputtering at relatively low temperatures can provide a dense amorphous film having a low level of trapped charge defects.

For applications in which crystalline optical films are desirable, collimated sputtering can be used at a temperature greater than the temperature for depositing amorphous films by collimation, but less than the temperature for depositing crystalline films without collimation. By using collimated sputtering to deposit the thin optical films, greater crystallinity and smaller grain size distributions can be obtained. For example, collimated sputtering can provide microcrystalline films or films having grains as small as several hundred Å with the resulting degree of crystallinity at least twice as great as the degree of crystallinity obtained without collimation. Moreover, collimated sputtering provides conditions that are favorable for the formation of crystalline films directly from the gas phase, without surface diffusion, as well as grains in the range of tens to hundreds of angstroms in diameter. Such nano-crystalline grains can be used in optical applications, for example, in which the optical wavelength is greater than the size of the grains, to provide a decrease in diffractive scattering. They also can be used in quantum well structures.

Substrate processing systems including cluster tools or linear tools having multiple PVD chambers can be used to deposit various layers of semiconductor, dielectric and other films is sequential steps to fabricate the devices discussed above as well as similar devices using the techniques described above. In general, each layer or film can be formed in a different chamber of the system with substrate handling devices such as robots transferring the substrates between chambers.

Other implementations are within the scope of the following claims.

What is claimed is:

1. A method of depositing a layer of a silicon-containing material, the method comprising:

providing a substrate in an evacuable chamber, wherein the substrate includes a glass plate;

providing a target comprising semiconducting silicon in the chamber spaced from the substrate;

sputtering the target with a gas plasma; and collimating trajectories of sputtered particles to a surface of the substrate using a collimator having an aspect ratio to form on the substrate surface a film of a silicon-containing material, wherein said sputtering step deposits said film as a semiconducting silicon material.

2. A method of depositing a layer of a silicon-containing material, the method comprising:

providing a substrate in an evacuable chamber;

providing a target comprising silicon in the chamber spaced from the substrate;

sputtering the target with a gas plasma;

collimating trajectories of sputtered particles to a surface of the substrate using a collimator having an aspect ratio to form on the substrate surface a film of a silicon-containing material; and providing a gaseous supply of dopants in a vicinity of the sputtered material.

3. A method of depositing a layer of a silicon-containing material, comprising:

providing a substrate in an evacuable chamber;

providing a target comprising semiconducting silicon in the chamber spaced from the substrate, wherein the target is a semiconductor silicon-based material containing dopants;

sputtering the target with a gas plasma; and collimating trajectories of sputtered particles to a surface of the substrate using a collimator having an aspect ratio to form on the substrate surface a film of a silicon-containing material, wherein said sputtering step deposits said film as a semiconducting silicon material.

4. A method of depositing a layer of a dielectric material, the method comprising:

providing a substrate in an evacuable chamber;

providing a target comprising a silicon-based target material in the chamber spaced from the substrate;

sputtering the target material with a gas plasma;

providing a reactive gas in a vicinity of the sputtered target material;

collimating trajectories of sputtered particles to a surface of the substrate using a collimator having an aspect ratio to form on the substrate surface a dielectric material; and isolating the substrate from electrically charged plasma particles by holding the collimator at a predetermined electrical potential, wherein the dielectric layer formed on the substrate has a trapped charge density of less than $1 \times 10^{11}$ per $cm^2$.

5. The method of claim 4 wherein the dielectric layer has a thickness of less than about 100 nm.

6. A method of depositing a layer of a dielectric material forming an optical film, the method comprising:

providing a substrate in an evacuable chamber;

providing a target material in the chamber spaced from the substrate;

sputtering the target material with a gas plasma;

providing a reactive gas in a vicinity of the sputtered target material; and collimating trajectories of sputtered particles to a surface of the substrate using a collimator having a plurality of holes extending therethrough along respective axes perpendicular to a principal surface of said substrate to form on the substrate surface a dielectric material forming said optical film.

7. The method of claim 6 wherein the dielectric material comprises a silicon compound selected from the group consisting of silicon nitride and silicon oxide.

8. A method of fabricating an operable electronic device having an electrically active junction, the method comprising:

forming a horizontally extending semiconductor layer and forming a horizontally extending dielectric layer in a vertical structure with a horizontally extending interface therebetween, wherein at least the semiconductor layer is formed by collimated sputtering, and wherein the semiconductor and dielectric layers are disposed vertically adjacent and contacting one another to form the electrically active junction of the operable electronic device across said horizontally extending interface.

9. The method of claim 8 wherein forming the semiconductor layer includes:

sputtering a target of a semiconductor material with a gas plasma; and collimating trajectories of sputtered semiconductor material particles toward a substrate using a collimator having an aspect ratio to form a film of the semiconductor material.

10. A method of fabricating an operable electronic device having an electrically active junction, the method comprising forming a semiconductor layer and forming a dielectric layer in a vertical structure, wherein at least the semiconductor layer is formed by collimated sputtering, and wherein the semiconductor and dielectric layers are disposed vertically adjacent and contacting one another to form the electrically active junction of the operable electronic device, and wherein forming said dielectric layer includes:

sputtering a target material with a gas plasma;

providing a reactive gas in a vicinity of the sputtered material; and collimating trajectories of sputtered particles toward a substrate with a collimator having a plurality of holes extending therethrough along respective axes perpendicular to a principal surface of said substrate in which said electronic devices are fabricated.

11. A method of fabricating a transistor, the method comprising: sputtering a target of a semiconductor material with a gas plasma;

collimating trajectories of sputtered semiconductor material particles toward a substrate using a first collimator having a first aspect ratio to form a layer of semiconductor material; and forming a dielectric layer adjacent the semiconductor layer using collimated sputtering;

wherein an interface between the semiconductor and dielectric layers forms an electrically active junction of the transistor.

12. The method of claim 11 wherein forming said dielectric layer includes:

sputtering a target material with a gas plasma;

providing a reactive gas in a vicinity of the sputtered target material; and collimating trajectories of sputtered material particles to a surface of the substrate using a second collimator having a second aspect ratio to form on the substrate surface a dielectric material.

13. The method of claim 11 further including:
forming doped semiconductor source and drain regions for the transistor using collimated sputtering.

14. A method of fabricating an operable electronic device having an electrically active junction, the method comprising:
forming in a vertical structure an intrinsic semiconductor layer and a doped semiconductor layer of a first conductivity type, wherein at least one of the intrinsic and doped layers is formed using collimated sputtering and wherein the intrinsic and doped layers are disposed vertically adjacent and contacting one another to form therebetween the electrically active junction of the operable electronic device.

15. The method of claim 14 wherein forming an intrinsic semiconductor layer includes:
sputtering a target of a semiconductor material with a gas plasma; and
collimating trajectories of sputtered semiconductor material particles toward a substrate using a collimator having an aspect ratio to form a film of the semiconductor material.

16. A method of fabricating an electronic device having an electrically active junction, the method comprising forming in a vertical structure an intrinsic semiconductor layer and a doped semiconductor layer of a first conductivity type,
wherein at least one of the intrinsic and doped layers is formed using collimated sputtering,
wherein the intrinsic and doped layers are disposed vertically adjacent one another to form the electrically active junction therebetween, and
wherein forming a doped semiconductor layer includes:
sputtering a target of a doped semiconductor material with a gas plasma; and
collimating trajectories of sputtered doped semiconductor material particles toward a substrate using a collimator having an aspect ratio to form a film of the doped semiconductor material.

17. A method of fabricating an electronic device having an electrically active junction, the method comprising forming in a vertical structure an intrinsic semiconductor layer and a doped semiconductor layer of a first conductivity type,
wherein at least one of the intrinsic and doped layers is formed using collimated sputtering,
wherein the intrinsic and doped layers are disposed vertically adjacent one another to form the electrically active junction therebetween, and
wherein forming a doped semiconductor layer includes:
sputtering a target of an intrinsic semiconductor material with a gas plasma;
providing a gaseous supply of dopants in a vicinity of the sputtered semiconductor material; and
collimating trajectories of sputtered semiconductor material particles toward a substrate using a collimator having an aspect ratio to form a film of the doped semiconductor material.

18. A method of fabricating an opto-electronic device for emitting or detecting light, the method comprising:
forming an intrinsic semiconductor layer;
forming a first semiconducting layer of a first conductivity type on one side of the intrinsic semiconductor layer; and
forming a second semiconducting layer of a second conductivity type opposite the first conductivity type on a second side of the intrinsic semiconductor layer;
wherein an interface between the first semiconducting layer and the intrinsic layer forms a first electrically active junction of the opto-electronic device and an interface between the intrinsic layer and the second semiconducting layer forms a second electrically active junction of the opto-electronic device, and
wherein at least one of the intrinsic semiconductor layers, the first semiconducting layer and the second semiconducting layer is formed using collimated sputtering.

19. The method of claim 18 wherein forming an intrinsic semiconductor layer includes:
sputtering a target of an intrinsic semiconductor material with a gas plasma; and
collimating trajectories of sputtered semiconductor particles toward a substrate using a collimator having an aspect ratio to form a film of the semiconductor material.

20. The method of claim 18 wherein forming the first semiconducting layer of said first conductivity type includes:
sputtering a target of a semiconductor material of the first conductivity type with a gas plasma; and
collimating trajectories of particles of the sputtered semiconductor material toward a substrate using a collimator having an aspect ratio to form a film of the semiconductor material.

21. The method of claim 18 wherein forming the first semiconductor layer of said first conductivity type includes:
sputtering a target of an intrinsic semiconductor material with a gas plasma;
providing a gaseous supply of dopants in a vicinity of the sputtered semiconductor material; and
collimating trajectories of sputtered semiconductor material particles toward a substrate suing a collimator having an aspect ratio to form a film of doped semiconducting material.

22. The method of any one of claims 4, 9, 10, 11, 15, 16, 19, 20 or 21 further including isolating the substrate from electrically charged plasma particles.

23. The method of claim 22 wherein isolating the substrate includes grounding the collimator.

24. The method of any one of claims 4, 9, 10, 11, 15, 16, 19, 20 or 21 further including isolating the substrate from electrically charged plasma particles to reduce creation of charge defects in films formed by collimated sputtering.

25. A method of forming a flat panel display, the method comprising:
providing a substrate including a glass plate;
forming a first dielectric layer on a surface of the substrate by collimated sputtering;
forming a second dielectric layer on selected regions of the first dielectric layer, wherein areas that include the second dielectric layer form pixel regions, and wherein areas without the second dielectric form non-pixel regions;

forming memory devices on the pixel regions; and forming high transconductance devices on the first dielectric layer.

26. The method of claim 25 wherein forming a second dielectric layer includes forming the second dielectric layer by collimated sputtering.

27. The method of claim 25 wherein forming memory devices includes forming transistors on the pixel regions, and wherein forming transistors includes:

forming a semiconductor layer adjacent a dielectric layer by collimated sputtering to form electrically active junctions of the transistors.

28. The method of claim 27 wherein forming a semiconductor layer includes:

sputtering a target of a semiconductor material with a gas plasma; and collimating trajectories of sputtered semiconductor material particles toward the substrate using a collimator having an aspect ratio to form the layer of semiconductor material.

29. The method of claim 4, wherein the dielectric material comprises silicon oxide.

30. The method of claim 25, wherein said first dielectric layer comprises a silicon-containing dielectric selected from the group consisting of silicon nitride and silicon oxide.

* * * * *